US009378958B2

(12) United States Patent
Wang et al.

(10) Patent No.: US 9,378,958 B2
(45) Date of Patent: Jun. 28, 2016

(54) ELECTROSTATIC DISCHARGE PROTECTION STRUCTURE AND FABRICATING METHOD THEREOF

(71) Applicant: UNITED MICROELECTRONICS CORPORATION, Hsinchu (TW)

(72) Inventors: Chang-Tzu Wang, Taoyuan County (TW); Yu-Chun Chen, Hsinchu County (TW); Tien-Hao Tang, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 88 days.

(21) Appl. No.: 13/729,034

(22) Filed: Dec. 28, 2012

(65) Prior Publication Data

US 2014/0183708 A1 Jul. 3, 2014

(51) Int. Cl.
*H01L 23/60* (2006.01)
*H01L 21/265* (2006.01)
*H01L 27/02* (2006.01)

(52) U.S. Cl.
CPC .............. *H01L 21/265* (2013.01); *H01L 23/60* (2013.01); *H01L 27/0277* (2013.01)

(58) Field of Classification Search
CPC ........................ H01L 27/0248; H01L 27/0251
USPC .......................................................... 257/360
See application file for complete search history.

(56) References Cited

U.S. PATENT DOCUMENTS 6,114,226 A * 9/2000 Chang et al. .................. 438/510
6,444,511 B1 * 9/2002 Wu et al. ....................... 438/199
6,452,236 B1 * 9/2002 Nadakumar ........ H01L 27/0277 257/355
6,548,874 B1 * 4/2003 Morton ................. H01L 27/092 257/344
6,765,771 B2 * 7/2004 Ker ..................... H01L 27/0262 257/E29.225
6,838,734 B2 * 1/2005 Ker et al. ...................... 257/360
6,878,996 B2 * 4/2005 Rothleitner ........... H01L 27/092 257/341
6,879,003 B1 * 4/2005 Cheng ................. H01L 27/0266 257/355
6,882,009 B2 * 4/2005 Ker ................... H01L 21/26586 257/349
6,956,266 B1 * 10/2005 Voldman ........... H01L 21/76237 257/347
7,064,407 B1 * 6/2006 Mallikarjunaswamy H01L 27/0727 257/287

(Continued)

FOREIGN PATENT DOCUMENTS

EP 1225636 A2 * 7/2002 ........ H01L 21/26513

OTHER PUBLICATIONS

Definition of the term "adjacent" from The American Heritage Dictionary of the English Language, 2000, date accessed online Jun. 1, 2015, 2 pages.*

*Primary Examiner* — Earl Taylor
(74) *Attorney, Agent, or Firm* — Ding Yu Tan

(57) ABSTRACT

A method of fabricating an electrostatic discharge protection structure includes the following steps. Firstly, a semiconductor substrate is provided. Plural isolation structures, a well region, a first conductive region and a second conductive region are formed in the semiconductor substrate. The well region contains first type conducting carriers. The first conductive region and the second conductive region contain second type conducting carriers. Then, a mask layer is formed on the surface of the semiconductor substrate, wherein a part of the first conductive region is exposed. Then, a first implantation process is performed to implant the second type conducting carriers into the well region by using the mask layer as an implantation mask, so that a portion of the first type conducting carriers of the well region is electrically neutralized and a first doped region is formed under the exposed part of the first conductive region.

8 Claims, 6 Drawing Sheets

V2 115 115b 115a 113b 112a 101 114b 112c 112 112b V1 110 117 100 114 113 111b 111a 113a 111 116

(56) References Cited

U.S. PATENT DOCUMENTS 7,135,743 B2* 11/2006 Manna et al. ................. 257/357
7,253,480 B2* 8/2007 Chen et al. .................... 257/355
7,288,449 B2* 10/2007 Ker et al. ...................... 438/200
7,326,998 B1* 2/2008 O ........................ H01L 27/0277 257/355
7,465,995 B2* 12/2008 Chu .................... H01L 27/0288 257/355
7,838,924 B2* 11/2010 Boselli ................ H01L 27/0259 257/328
7,910,998 B2* 3/2011 Hwang et al. ................. 257/355
8,080,832 B1* 12/2011 Boyd .................. H01L 27/0262 257/173
8,110,853 B2* 2/2012 Voldman ....................... 257/170
8,283,973 B2* 10/2012 Hashimoto ....... H01L 29/66068 257/299
8,299,544 B2* 10/2012 Abou-Khalil ......... H01L 21/743 257/288
8,575,691 B2* 11/2013 Liu et al. ....................... 257/335
8,664,723 B1* 3/2014 Tseng ................. H01L 27/0277 257/355
2002/0122280 A1* 9/2002 Ker et al. ........................ 361/56
2002/0130390 A1* 9/2002 Ker ..................... H01L 27/0255 257/546
2003/0168701 A1* 9/2003 Voldman ............. H01L 27/0255 257/355
2003/0227053 A1* 12/2003 Nomura .............. H01L 27/0277 257/344
2004/0043568 A1* 3/2004 Ker et al. ...................... 438/279
2004/0190209 A1* 9/2004 Jozwiak et al. ................. 361/56
2005/0042815 A1* 2/2005 Williams .......... H01L 21/26513 438/202
2005/0045956 A1* 3/2005 Chen et al. .................... 257/355
2005/0133868 A1* 6/2005 Su ....................... H01L 29/7436 257/355
2005/0275032 A1* 12/2005 Kodama ................ H01L 23/585 257/355
2006/0113600 A1* 6/2006 Salling ................ H01L 27/0277 257/360
2007/0004160 A1* 1/2007 Voldman ............. H01L 27/0255 438/309
2007/0210387 A1* 9/2007 Russ ................... H01L 29/0626 257/362
2008/0191277 A1* 8/2008 Disney et al. ................. 257/343
2008/0237706 A1* 10/2008 Williams .............. H01L 21/761 257/343
2010/0019318 A1* 1/2010 Chao ................... H01L 29/7833 257/336
2010/0032758 A1* 2/2010 Wang .................. H01L 29/7816 257/343
2010/0193869 A1* 8/2010 Habasaki ...................... 257/360
2011/0101444 A1* 5/2011 Coyne ................. H01L 27/0259 257/328
2011/0260254 A1* 10/2011 Kim .................... H01L 27/0277 257/355
2012/0139013 A1* 6/2012 Bahl ................... H01L 29/7722 257/266
2012/0161235 A1* 6/2012 Huang ................ H01L 27/0277 257/355
2012/0161236 A1* 6/2012 Huang ................ H01L 27/0277 257/355
2012/0168878 A1* 7/2012 Abou-Khalil et al. ........ 257/401
2012/0199878 A1* 8/2012 Shrivastava ......... H01L 29/0653 257/192
2012/0205744 A1* 8/2012 O .......................... H01L 21/266 257/352
2012/0313175 A1* 12/2012 Wang .............. H01L 21/823481 257/355
2013/0093009 A1* 4/2013 Chen ................. H01L 29/41758 257/335
2013/0105904 A1* 5/2013 Roybal ........... H01L 21/823892 257/369
2013/0207184 A1* 8/2013 Chen ................... H01L 29/7835 257/339
2013/0208379 A1* 8/2013 Wang .................. H01L 29/7436 361/56
2014/0070361 A1* 3/2014 Benaissa ............. H01L 27/0802 257/509
2014/0183596 A1* 7/2014 Wang .................. H01L 29/7436 257/141
2014/0183708 A1* 7/2014 Wang .................. H01L 27/0277 257/659

* cited by examiner 130
100
130a
116
112
111

ELECTROSTATIC DISCHARGE PROTECTION STRUCTURE AND FABRICATING METHOD THEREOF

FIELD OF THE INVENTION

The present invention relates to a semiconductor structure and a fabricating method thereof, and more particularly to an electrostatic discharge protection structure and a fabricating method thereof.

BACKGROUND OF THE INVENTION

In the process of producing or using a semiconductor device, electrostatic discharge (ESD) may result in sudden flow of electricity. The sudden flow of electricity may cause damage to the semiconductor device or the functional circuit, and reduce the production efficiency and the product yield.

In the deep sub-micron and nano-scale process, the size of the semiconductor device is gradually decreased, and the ESD tolerance is deteriorated. Consequently, it is necessary to increase the ESD protection capability. Conventionally, many ESD protection structures are disclosed to achieve ESD protection. However, the performance of the semiconductor device or the functional circuit to be protected may be impaired by these ESD protection structures.

Therefore, there is a need of providing an improved electrostatic discharge protection structure with good ESD protection capability while maintaining the performance of the semiconductor device or the functional circuit.

SUMMARY OF THE INVENTION

In accordance with an aspect, the present invention provides a method of fabricating an electrostatic discharge protection structure. Firstly, a semiconductor substrate is provided. Plural isolation structures, a well region, a first conductive region and a second conductive region are formed in the semiconductor substrate. The well region contains first type conducting carriers. The first conductive region and the second conductive region contain second type conducting carriers. The well region is arranged between the plural isolation structures. The first conductive region and the second conductive region are formed in a surface of the semiconductor substrate over the well region. Then, a mask layer is formed on the surface of the semiconductor substrate, wherein a part of the first conductive region is exposed. Then, a first implantation process is performed to implant the second type conducting carriers into the well region by using the mask layer as an implantation mask, so that a portion of the first type conducting carriers of the well region is electrically neutralized and a first doped region is formed under the exposed part of the first conductive region.

In accordance with another aspect, the present invention provides an electrostatic discharge protection structure. The electrostatic discharge protection structure includes a semiconductor substrate, a well region, a first conductive region, a second conductive region, and a first doped region. Plural isolation structures are formed in the semiconductor substrate. The well region is formed in the semiconductor substrate, and arranged between the plural isolation structures. The well region contains first type conducting carriers. The first conductive region and the second conductive region are formed in a surface of the semiconductor substrate over the well region. The first conductive region and the second conductive region contain second type conducting carriers. The first doped region is disposed under the first conductive region.

In accordance with the present invention, a high resistance region is formed in the electrostatic discharge protection structure. Consequently, the breakdown voltage of the electrostatic discharge protection structure and the path of the ESD current flowing through the electrostatic discharge protection structure are adjustable. In other words, the electrostatic discharge protection structure of the present invention is capable of protecting the semiconductor device and enhancing the device performance.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1E are schematic cross-sectional views illustrating a partial process flow of a method of fabricating an electrostatic discharge protection structure according to an embodiment of the present invention.

Figure 1A:
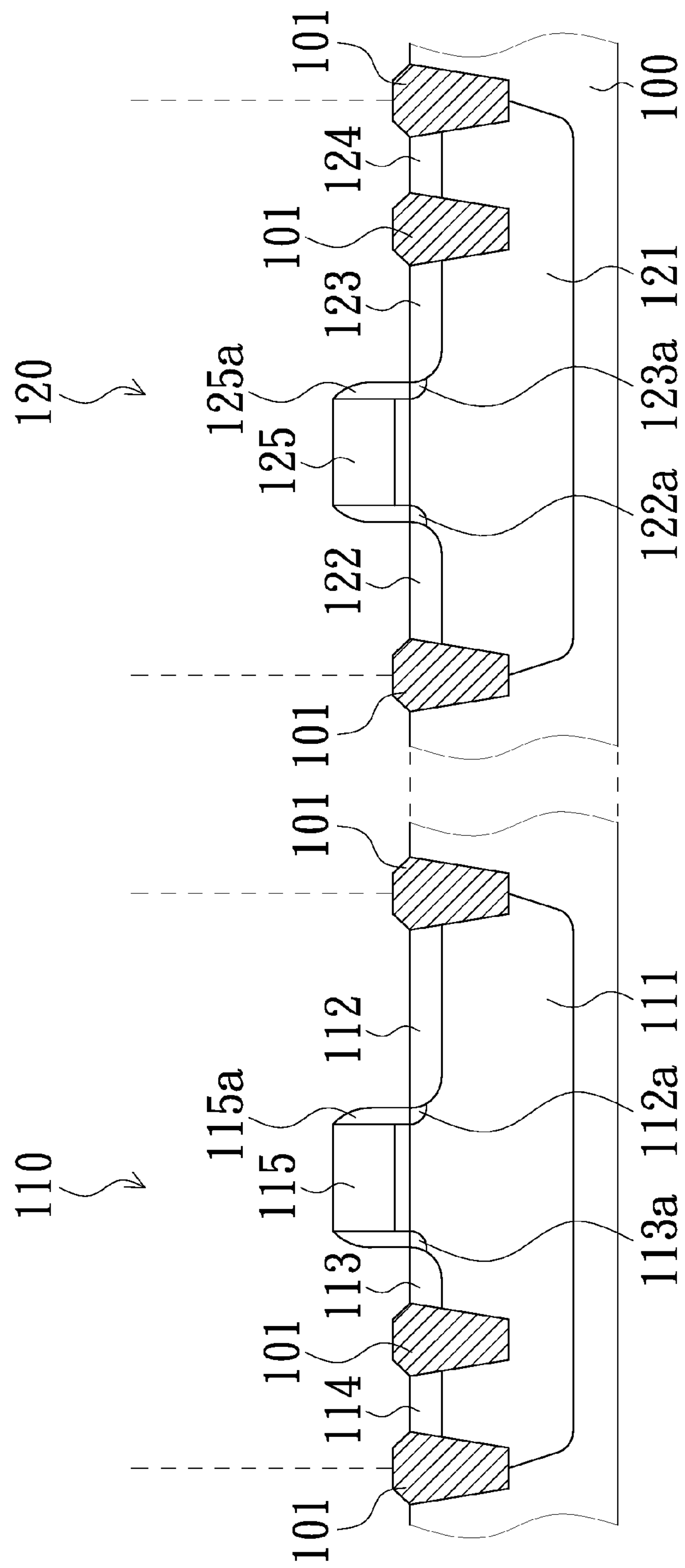
FIGS. 1A~1E are schematic cross-sectional views illustrating a partial process flow of a method of fabricating an electrostatic discharge protection structure according to an embodiment of the present invention.

Firstly, as shown in FIG. 1A, a semiconductor substrate 100 with a plurality of isolation structures 101 is provided. Some of the isolation structures 101 are used to define an electrostatic discharge protection structure 110 and a device region 120. A well region (111, 121), a first conductive region (112, 122) and a second conductive region (113, 123) are formed in the semiconductor substrate 100 corresponding to the electrostatic discharge protection structure 110 and the device region 120. The well region (111, 121) contains first type conducting carriers. The first conductive region (112, 122) and the second conductive region (113, 123) contain second type conducting carriers. The well region (111, 121) is arranged between these isolation structures 101. The first conductive region (112, 122) and the second conductive region (113, 123) are formed in a surface of the semiconductor substrate 100 over the well region (111, 121). The concentration of the second type conducting carriers of the first conductive region (112, 122) and the second conductive region (113, 123) is higher than the concentration of the first type conducting carriers of the well region (111, 121).

In this embodiment, the semiconductor substrate 100 is a silicon substrate, and is also doped with the first type conducting carriers. The process of forming the electrostatic discharge protection structure 110 may be integrated into the process of forming the device region 120, for example a MOS process, a CMOS process or a Bi-CMOS process. For example, after multiple implantation processes are performed to implant the first type conducting carriers into the semiconductor substrate 100 corresponding to the electrostatic discharge protection structure 110 and the device region 120, the well region (111, 121) with the first type conducting carriers are formed. After a first gate structure 115 and a second gate structure 125 are formed on the surface of the semiconductor substrate 100, a mask layer (not shown) is partially formed on the surface of the semiconductor substrate 100 corresponding to the electrostatic discharge protection structure 110 and the device region 120. Then, an implantation process is performed to implant the second type conducting carriers into the exposed parts of the electrostatic discharge protection structure 110 and the device region 120, wherein the concentration of the second type conducting carriers is higher than the concentration of the first type conducting carriers of the well region (111, 121). Consequently, plural lightly doped drain (LDD) regions with the second type conducting carriers are formed. Then, two sidewalls 115*a* and 125*a* are formed on the first gate structure 115 and the second gate structure 125, respectively. Then, a mask layer (not shown) is partially formed on the surface of the semiconductor substrate 100 while exposing a part of the surfaces of the lightly doped drain regions. Then, an implantation process is performed to implant the second type conducting carriers into the exposed parts of the semiconductor substrate 100, wherein the concentration of the second type conducting carriers of the exposed parts of the semiconductor substrate 100 is higher than that of the lightly doped drain regions. Consequently, the first conductive region (112, 122) and the second conductive region (113, 123) with the higher concentration of the second type conducting carriers and a plurality of lightly doped drain (LDD) regions 112*a*, 122*a*, 113*a* and 123*a* with the lower concentration of the second type conducting carriers are formed. Then, a mask layer (not shown) is partially formed over the first conductive region (112, 122), the second conductive region (113, 123), the gate structures 115 and 125 and the sidewalls 115*a* and 125*a*, while exposing a part of the semiconductor substrate 100 corresponding to the electrostatic discharge protection structure 110 and the device region 120. Then, an implantation process is performed to implant the first type conducting carriers into the exposed parts of the semiconductor substrate 100 to increase the concentration of the first type conducting carriers in parts of the well region (111, 121). Consequently, a third conductive region (114, 124) with the higher concentration of the first type conducting carriers is formed.

For clarification and brevity, only the cross-sectional view of the electrostatic discharge protection structure 110 will be shown in FIGS. 1B~1E.

Figure 1B:
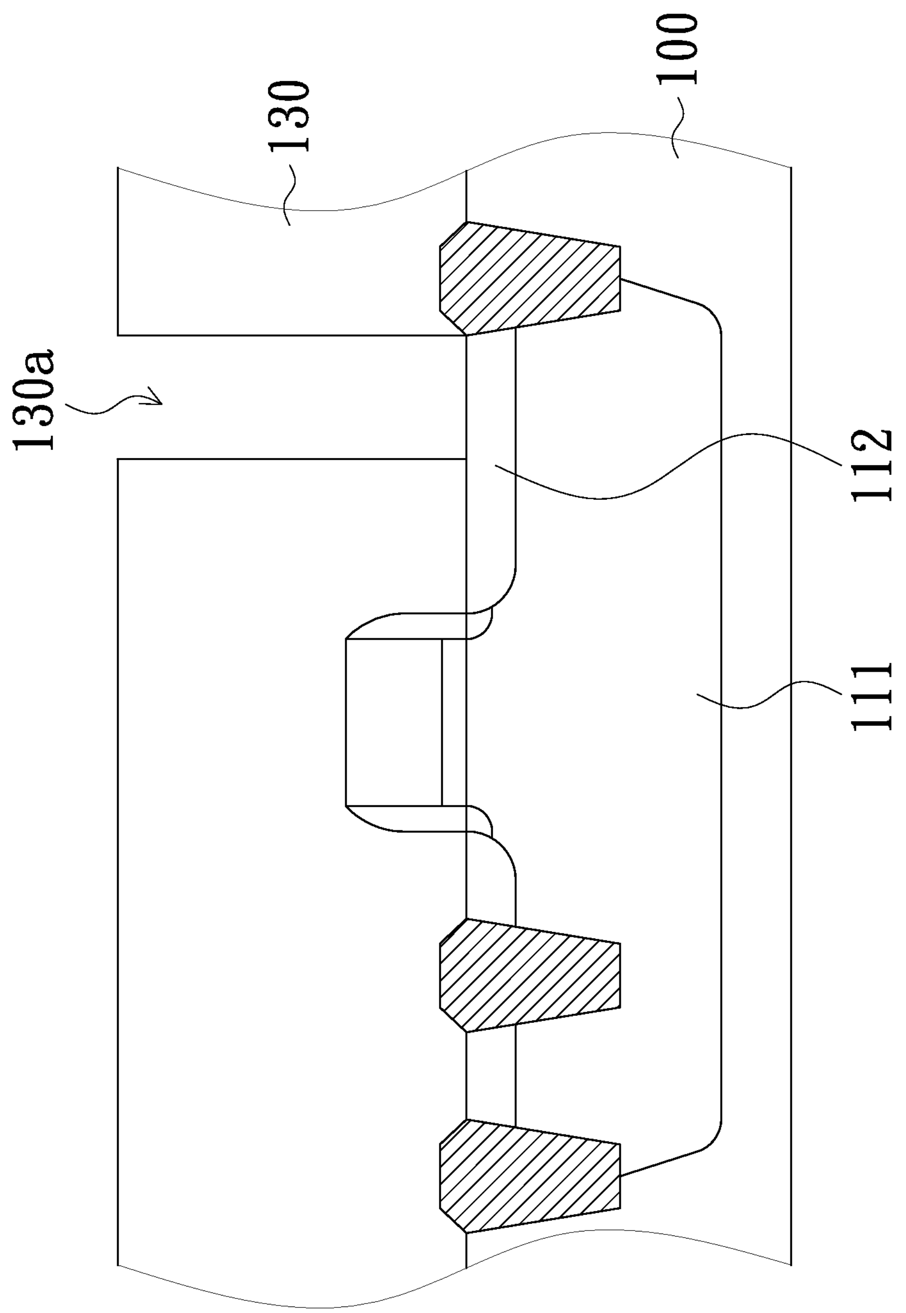

Then, as shown in FIG. 1B, a mask layer 130 is formed on the surface of the semiconductor substrate 100. A part of the first conductive region 112 is exposed through an opening 130*a* of the mask layer 130. By using the mask layer 130 as an implantation mask, a first implantation process is performed to implant the second type conducting carriers to electrically neutralize a portion of the first type conducting carriers of the well region 111. In this embodiment, the first type conducting carriers are P type carriers (e.g. hole carriers), and the second type conducting carriers are N type carriers (e.g. electron carriers). By performing the first implantation process, the N type carriers such as phosphorus atoms (P) or arsenic atoms (As) are implanted into the well region 111 (i.e. a P well) to neutralize the portion of the first type conducting carriers. Consequently, the concentration of the first type conducting carriers of the well region 111 is reduced. Alternatively, in some other embodiments, the first type conducting carriers are N type carriers (e.g. electron carriers), and the second type conducting carriers are P type carriers (e.g. hole carriers). By performing the first implantation process, the P type carriers such as boron atoms (B) or gallium atoms (Ga) are implanted into the well region 111 (i.e. an N well) to neutralize the portion of the first type conducting carriers. In accordance with the present invention, the carrier types of the first type conducting carriers and the second type conducting carriers are not restricted.

Figure 1C:
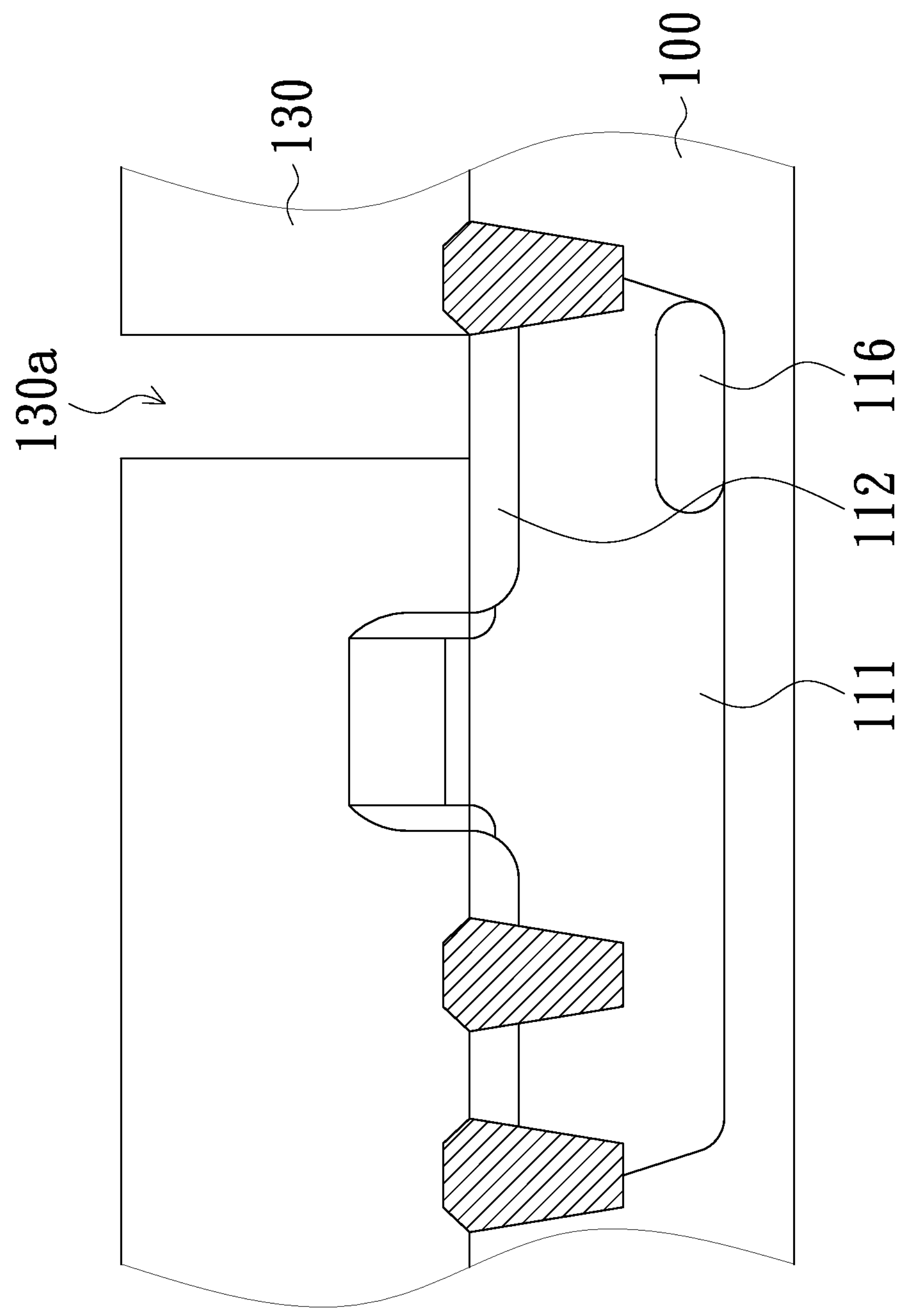

After the first implantation process is completed, as shown in FIG. 1C, a first doped region 116 is formed under the exposed part of the first conductive region 112 (N+). The first doped region 116 is separated from the first conductive region 112 by the unneutralized P well region 111. In particular, the type, the concentration or the implantation range of the first doped region 116 may be controlled by adjusting the process parameters of the first implantation process. For example, the process parameters include the dopant concentration, the implantation duration, the implantation angle, the implantation energy, the annealing diffusion, and so on. In this embodiment, after a portion of the hole carriers of the P well region 111 are electrically neutralized by the first implantation process, the first doped region 116 is a low-concentration electron carrier region (N−). Alternatively, in some other embodiments, the first doped region 116 may be an electrically-neutral region or a low-concentration hole carrier region (P−). Since the concentration of the conducting carriers of the first doped region 116 is lower than the concentration of the conducting carriers of the P well region 111, the first doped region 116 may be considered as a high resistance region. Under this circumstance, if an ESD current is generated at the electrostatic discharge protection structure 110, the path of the ESD current is adjusted according to the resistance profile of the electrostatic discharge protection structure 110.

Figure 1D:
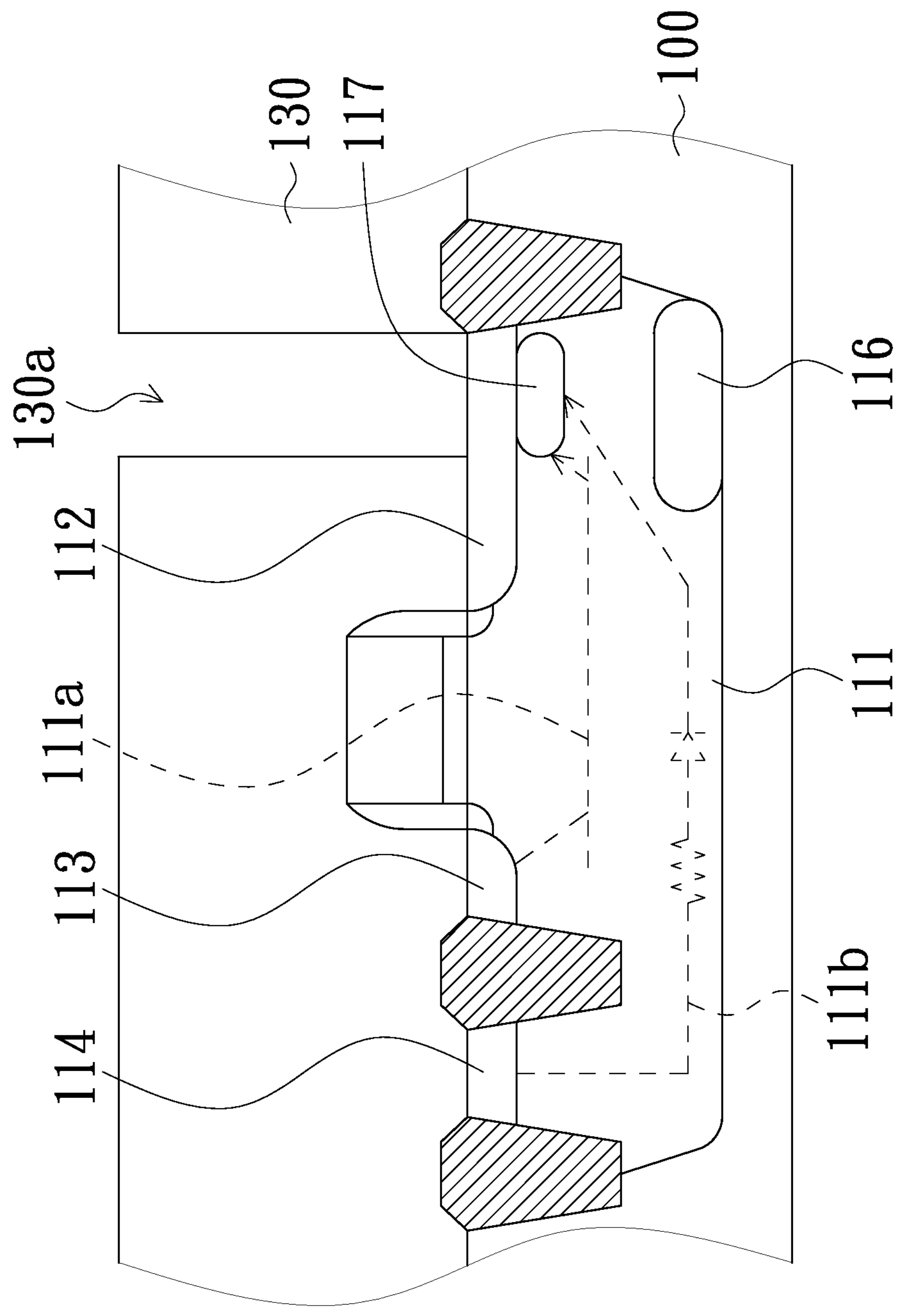

Optionally, by using the same mask layer 130 as an implantation mask, a second implantation process is performed to increase the concentration of the first type conducting carriers of the unneutralized well region 111. Consequently, a second doped region 117 is formed between the exposed part of the first conductive region 112 and the first doped region 116. Under this circumstance, the first conductive region 112, the well region 111 and the second conductive region 113 collaboratively define a parasitic bipolar junction transistor 111*a* (also referred as a parasitic BJT). In addition, the first conductive region 112, the well region 111 and the third conductive region 114 collaboratively define a parasitic diode with a serially-connected resistor 111*b*, which is indicated by a dotted circuit symbol. In this embodiment, the parasitic bipolar junction transistor is an NPN BJT. After the second implantation process is performed, the P type carriers are implanted into the unneutralized P well region 111. Consequently, the concentration of the hole carriers in a part of the unneutralized P well region 111 is increased. As shown in FIG. 1D, the second doped region 117 (P+) is contacted with a bottom of the first conductive region 112 (N+). Under this circumstance, a high-concentration PN junction is formed between the second doped region 117 (P+) and the first conductive region 112 (N+) to effectively reduce the breakdown voltage of the bipolar junction transistor.

Figure 1E:
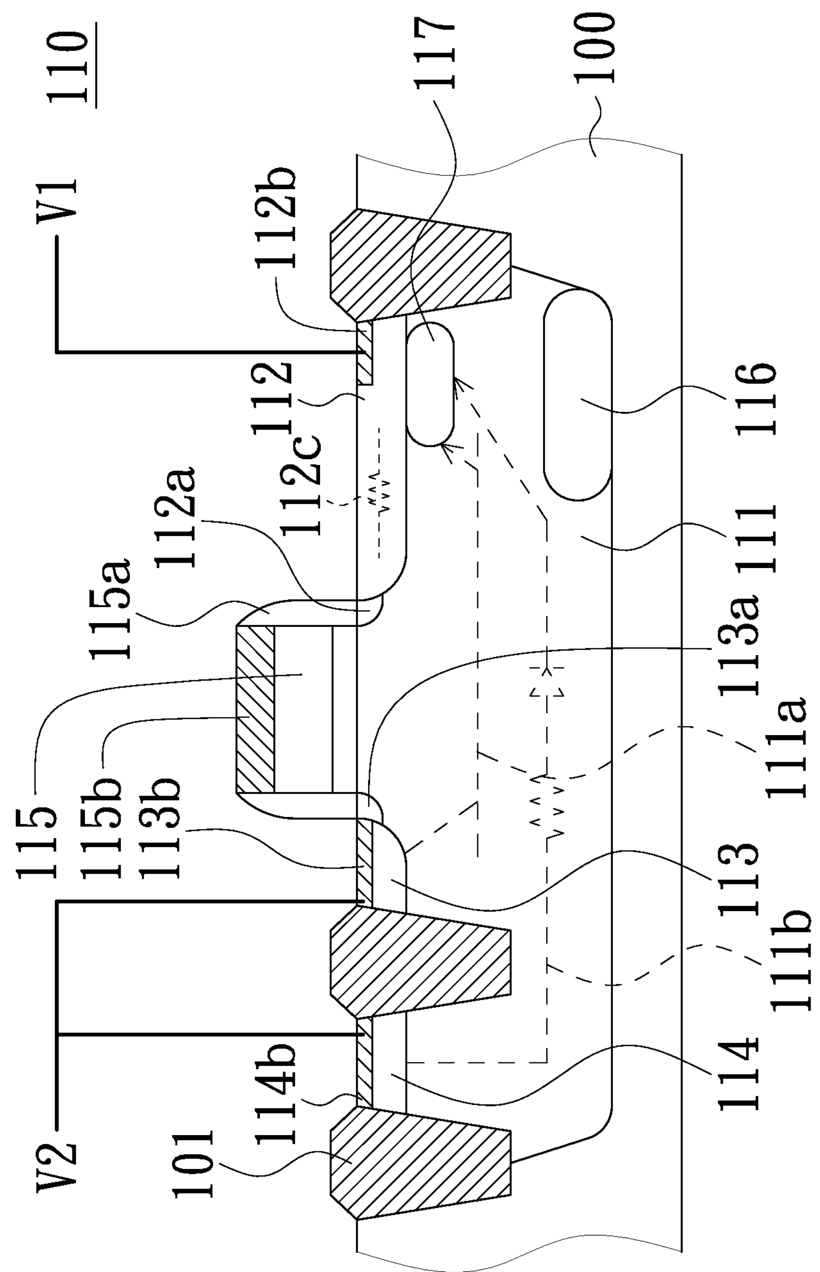

Then, as shown in FIG. 1E, the mask layer 130 is removed. Then, the electrostatic discharge protection structure 110 and the device region 120 are subjected to a salicide process simultaneously. Consequently, a plurality of salicide layers 112*b*, 113*b*, 114*b* and 115*b* are formed in the first conductive region 112, the second conductive region 113, the third conductive region 114 and the gate structure 115, respectively. These salicide layers 112*b*, 113*b*, 114*b* and 115*b* may be used as the contact regions of the interconnection structures of the semiconductor device. In this embodiment, the length of the salicide layer 112*b* may be adjusted according to the practical requirements. For example, a salicide blocking process may be optionally performed to change the length of the salicide layer 112*b*, thereby adjusting the resistance value of the first conductive region 112. As shown in FIG. 1E, a resistor 112*c* in the first conductive region 112 is indicated by a dotted circuit symbol.

After the resulting structure of FIG. 1E is produced, the interconnection structures of the semiconductor device are sequentially formed. For example, the first conductive region 112 (N+) is electrically connected to a drain voltage V1, and the second conductive region 113 (N+) and the third conductive region 114 (P+) are electrically connected to a ground voltage V2. After the process of forming the interconnection structures of the semiconductor device is completed, if an ESD current is generated, the ESD current can be quickly transmitted to ground through the paths of the parasitic BJT 111*a* and the parasitic diode with a serially-connected resistor 111*b* of the electrostatic discharge protection structure 110. Under this circumstance, since the energy from the ESD current is uniformly released, the possibility of causing damage of the electrostatic discharge protection structure 110 and the device region 120 will be largely reduced. In a case that the signals are normally outputted or inputted, the electrostatic discharge protection structure 110 is in an off state. Since the electrostatic discharge protection structure 110 comprises the high-resistance first doped region 116, the electrostatic discharge protection structure 110 is not in the on state to generate a leakage current.

Figure 2:
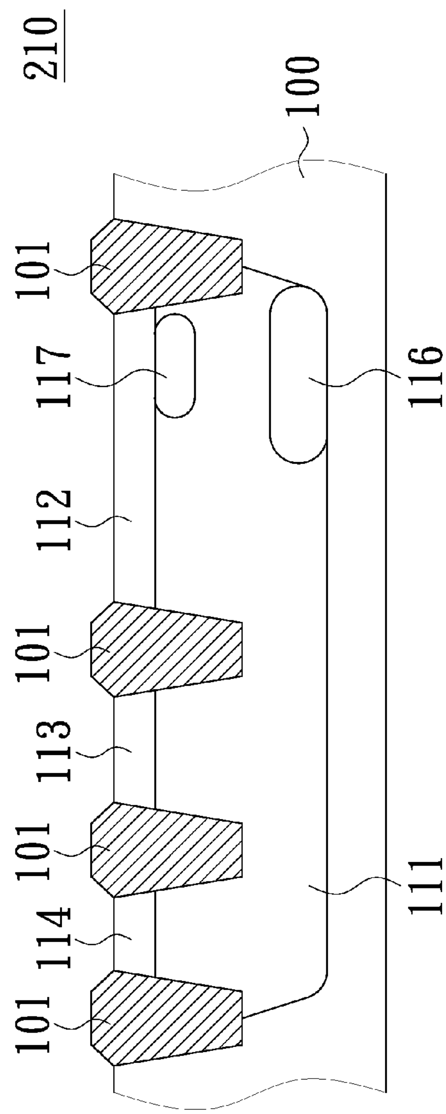
FIG. 2 is a schematic cross-sectional view illustrating an electrostatic discharge protection structure according to another embodiment of the present invention.

FIG. 2 is a schematic cross-sectional view illustrating an electrostatic discharge protection structure according to another embodiment of the present invention. In this embodiment, the electrostatic discharge protection structure 210 has a bipolar junction transistor (BJT) configuration. Similarly, the process of forming the electrostatic discharge protection structure 210 may be integrated into the process of forming the device region (not shown). In comparison with the electrostatic discharge protection structure 110 of the first embodiment, no gate structure and no LDD region are formed in the electrostatic discharge protection structure 210 of the another embodiment. Moreover, the first conductive region 112 and the second conductive region 113 are separated from each other by an isolation structure 101.

Figure 3:
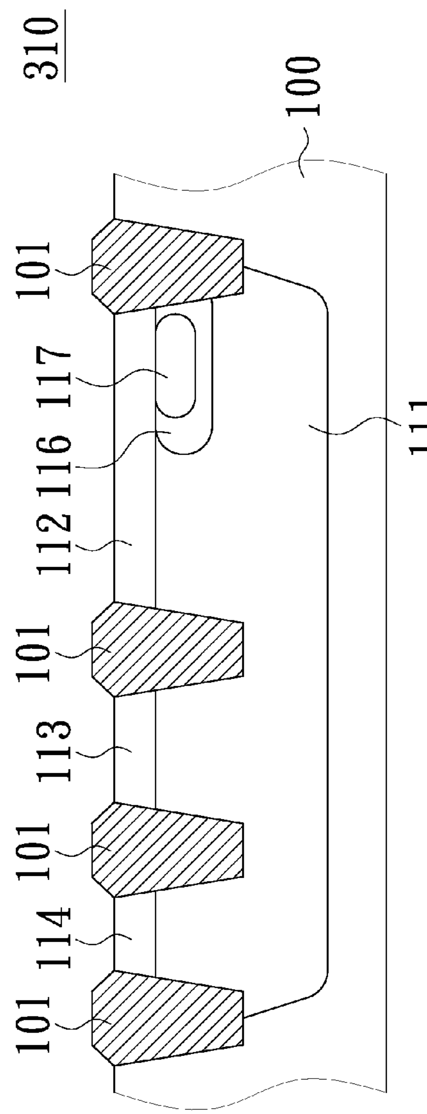
FIG. 3 is a schematic cross-sectional view illustrating an electrostatic discharge protection structure according to a further embodiment of the present invention.

FIG. 3 is a schematic cross-sectional view illustrating an electrostatic discharge protection structure according to a further embodiment of the present invention. In this embodiment, the electrostatic discharge protection structure 310 has a silicon controller rectifier (SCR) configuration. Similar to that shown in FIG. 2, the first conductive region 112 and the second conductive region 113 of the electrostatic discharge protection structure 310 are separated from each other by an isolation structure 101. In comparison with the electrostatic discharge protection structure 210 of the another embodiment, the second doped region 117 of the electrostatic discharge protection structure 310 is contacted with the first conductive region 112 and the first doped region 116. The second doped region 117 is enclosed by the first doped region 116. Consequently, two PN junctions are formed between the first conductive region 112, the second doped region 117 and the first doped region 116. The first conductive region 112, the second doped region 117, the first doped region 116 and the third conductive region 114 collaboratively define the silicon controller rectifier (SCR). Under this further embodiment, if an ESD current is generated, the ESD current can be quickly transmitted to ground through the path of the silicon controller rectifier.

From the above descriptions, the present invention provides an electrostatic discharge protection structure and a fabricating method thereof. Since the process of forming the electrostatic discharge protection structure may be integrated into the process of forming the device region, the fabricating cost is reduced. Moreover, by using a single mask layer as an implantation mask, an implantation process is performed to form a high resistance region in the electrostatic discharge protection structure. Consequently, the breakdown voltage of the electrostatic discharge protection structure and the path of the ESD current flowing through the electrostatic discharge protection structure are adjustable. Consequently, the ESD current can be quickly transmitted to ground. In other words, the electrostatic discharge protection structure of the present invention is capable of protecting the semiconductor device and enhancing the device performance.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electrostatic discharge protection structure, comprising:

a semiconductor substrate, wherein a plurality of isolation structures are formed in the semiconductor substrate;

a gate structure formed on the semiconductor substrate;

a well region formed in the semiconductor substrate and arranged between the plurality of isolation structures, wherein the well region contains first type conducting carriers;

a first conductive region and a second conductive region formed in a surface of the semiconductor substrate on respective sides of the gate structure over the well region, wherein the first conductive region and the second conductive region contain second type conducting carriers, and the first conductive region is in direct contact with one of the plurality of isolation structures; and a first doped region disposed right under the first conductive region and not under the gate structure in a cross sectional view, wherein the first doped region contains the first type conducting carriers, the first doped region is separated from the first conductive region by the well region, and a concentration of the first type conducting carriers of the first doped region is lower than the concentration of the first type conducting carriers of the well region.

2. The electrostatic discharge protection structure according to claim 1, further comprising a second doped region, which is arranged between the first doped region and the first conductive region and contains the first type conducting carriers, wherein a concentration of the first type conducting carriers of the second doped region is higher than a concentration of the first type conducting carriers of the well region.

3. The electrostatic discharge protection structure according to claim 2, wherein the second doped region is contacted with a bottom of the first conductive region.

4. The electrostatic discharge protection structure according to claim 3, wherein the first doped region and the second doped region are separated from each other by the well region.

5. The electrostatic discharge protection structure according to claim 1, wherein the first type conducting carriers are holes, and the second type conducting carriers are electrons.

6. The electrostatic discharge protection structure according to claim 5, further comprising a third conductive region, which is formed in the surface of the semiconductor substrate over the well region and contains the first type conducting carriers, wherein the first conductive region, the second conductive region and the third conductive region are separated from each other by the well region, wherein a concentration of the first type conducting carriers of the third conductive region is higher than a concentration of the first type conducting carriers of the well region.

7. The electrostatic discharge protection structure according to claim 6, wherein the first conductive region is connected to a high voltage, and the second conductive region and the third conductive region are connected to a low voltage.

8. The electrostatic discharge protection structure according to claim 1, wherein the second conductive region is in direct contact with one of the plurality of isolation structures.

* * * * *